United States Patent
Hirata et al.

(10) Patent No.: US 6,853,228 B2
(45) Date of Patent: Feb. 8, 2005

(54) FLIP-FLOP CIRCUIT

(75) Inventors: Akio Hirata, Kyoto (JP); Masahiro Gion, Kyoto (JP); Kazuyuki Nakanishi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/686,597

(22) Filed: Oct. 17, 2003

(65) Prior Publication Data

US 2004/0080351 A1 Apr. 29, 2004

(30) Foreign Application Priority Data

Oct. 18, 2002 (JP) ........................................ 2002-304900

(51) Int. Cl.[7] .............................................. H03K 3/037
(52) U.S. Cl. ...................... 327/199; 327/208; 327/212; 327/218
(58) Field of Search ................................ 327/199, 200, 327/202, 203, 208, 210–212, 214, 215, 218, 219; 326/93, 95, 98

(56) References Cited

U.S. PATENT DOCUMENTS 5,917,355 A * 6/1999 Klass ........................ 327/208
6,023,179 A * 2/2000 Klass ........................ 327/211
6,265,923 B1 * 7/2001 Amir et al. ................. 327/218

OTHER PUBLICATIONS

Fabian Klass, "Semi–Dyanmic Flip–Flops with Embedded Logic." IEEE Symposium on VLSI Circuits Digest of Technical Papers, 1998 pp 108–109.

* cited by examiner

*Primary Examiner*—Long Nguyen
(74) *Attorney, Agent, or Firm*—McDermott Will & Emery LLP

(57) ABSTRACT

In a flip-flop circuit which includes an input section using a dynamic circuit and an output section using a static circuit and which captures data during a period of a pulse width shorter than a clock cycle, the number of transistors, circuit area and power consumption are reduced. In FIG. 1, an output signal of an inverter circuit INV1 constituting a latch circuit 2 connected to the output terminal of an input section 1 is used as an input signal of a control section 3. Thus, a control signal output from the control section 3 to the input section 1 is stabilized, thereby suppressing unnecessary operation of circuit elements and reducing unnecessary power consumption. In addition, the configuration of the control section 3 is simplified. As a result, the number of transistors constituting the circuit and the circuit area can be reduced.

10 Claims, 13 Drawing Sheets

FLIP-FLOP CIRCUIT

BACKGROUND OF THE INVENTION

The present invention relates to flip-flop circuits operating at high speed. More particularly, the present invention relates to a flip-flop circuit including a small number of transistors and exhibiting low power consumption.

In general, a flip-flop circuit has a great influence on the area, power consumption and critical path delay of a logic circuit in a semiconductor integrated circuit. Therefore, there has been a demand for reducing the area and power consumption of the flip-flop circuit and for increasing the speed of the flip-flop circuit.

Flip-flop circuits using latch circuits which capture data during a period of a pulse width shorter than a clock cycle have been proposed to date. Hereinafter, a known flip-flop circuit having such a configuration will be described.

FIG. 13 shows a configuration of a flip-flop circuit called a semi-dynamic flip-flop (SDFF).

In FIG. 13, reference sign D denotes an input terminal, reference sign CK denotes a clock terminal and reference sign Q denotes an output terminal. Reference signs MP1 and MP2 denote PMOS transistors, reference signs MN1, MN2, MN3, MN4 and MN5 denote NMOS transistors, reference signs INV1, INV2, INV3, INV4, INV5 and INV6 denote inverter circuits, and reference sign NAND1 denotes a NAND circuit. Reference signs CKD and n1 denote nodes, reference sign IQ denotes an inner output terminal and reference sign QB denotes an inverted output terminal.

The PMOS transistor MP1 and the three NMOS transistors MN1, MN2 and MN3 are connected in series. The PMOS transistor MP1 has a source connected to a power source and the NMOS transistor MN3 has a source connected to a ground. The inverter circuits INV1 and INV2 constitute a delay circuit which transmits a clock signal at the clock terminal CK (hereinafter, referred to as a clock signal CK) to an input terminal of the NAND circuit NAND1 with a delay, and the inverter circuits INV1 and INV2 are connected in series and inserted between the clock terminal CK and the input terminal of the NAND circuit NAND1. The NAND circuit NAND1 has two input terminals, one of which is a node CKD connected to an output terminal of the inverter circuit INV2, and the other is a node n1. The node n1 connects a connection point between the PMOS transistor MP1 and the NMOS transistor MN1, an output terminal of the inverter circuit INV3 and a connection point between the PMOS transistor MP2 and the NMOS transistor MN5, together. The NAND circuit NAND1 has an output terminal connected to a gate terminal of the NMOS transistor MN1. The inverter circuits INV3 and INV4 constitute a latch circuit in which an output terminal of the inverter circuit INV3 is connected to an input terminal of the inverter circuit INV4 and an output terminal of the inverter circuit INV4 is connected to an input terminal of the inverter circuit INV3. To hold the value at the node n1, the output terminal of the inverter circuit INV3 and the input terminal of the inverter circuit INV4 are connected to the node n1. The PMOS transistor MP2 and the NMOS transistors MN4 and MN5 are connected in series. The PMOS transistor MP2 has a source connected to a power source and the NMOS transistor MN5 has a source connected to a ground. The clock terminal CK is connected to the gate of the PMOS transistor MP1, to the respective gates of the NMOS transistors MN3 and MN4, and to an input terminal of the inverter circuit INV1. As the inverter circuits INV3 and INV4, the inverter circuits INV5 and INV6 constitute a latch circuit, thereby holding the value at the inverted output terminal QB.

In U.S. Pat. No. 5,917,355 (columns 3 through 7 and FIG. 4), the inverter circuit INV7 is not used at an output stage, and the flip-flop circuit directly drives an outside component from the internal output terminal IQ. However, in order to prevent data held in the inverter circuits INV5 and INV6 from changing due to the influence of a crosstalk noise applied to the output line, or to prevent the operation speed from decreasing extremely when an output load is heavy, it is practical to drive the output load using the inverter circuit INV7. In view of this, the case where the inverter circuit INV7 is provided will be hereinafter described.

In FIG. 13, in an initial state in which the clock signal CK is at a low level, the node n1 is charged by the PMOS transistor MP1 so that a signal at the first node n1 changes to a high level. At this time, the NMOS transistor MN4 and the PMOS transistor MP2 are cut off so that the value at the output terminal Q is held at a previous value.

Subsequently, when the clock signal CK changes to the high level, a signal at the node CKD does not change to a high level immediately but is delayed by the inverter circuits INV1 and INV2 and changes to a high level. During a period in which the clock signal CK is at the high level and the signal at the node CKD is at a low level (hereinafter, referred to as an evaluation phase), the NMOS transistor MN1 is ON. Accordingly, if an input signal at the input terminal D (hereinafter, referred to as an input signal D) is at a high level during this phase, the signal at the node n1 changes to a low level due to a discharge, then a signal at the inner output terminal IQ is changed to a high level by turning ON the PMOS transistor MP2, and then an output signal at the output terminal Q also changes to a high level with a delay. On the other hand, if the input signal D is at a low level during the evaluation phase, the NMOS transistor MN2 is OFF. Accordingly, the signal at the node n1 remains at the high level and the NMOS transistors MN4 and MN5 turn ON so that the signal at the inner output terminal IQ changes to a low level, and then the output signal at the output terminal Q also changes to a low level with a delay.

Thereafter, the circuit enters a period in which the clock signal CK is at the high level and the signal at the node CKD is at the high level (hereinafter, referred to as hold phase). In this period, if the signal at the node n1 is at the high level, the NAND circuit NAND1 cuts off the NMOS transistor MN1 so that the inverter circuits INV3 and INV4 keep the signal at the node n1 at the high level without being affected by the value of the input signal D. On the other hand, in a case where the circuit enters the hold time with the signal at the node n1 at the low level, the PMOS transistor MP1 is OFF, so that the inverter circuits INV3 and INV4 keep the signal at the node n1 at the low level, independently of the value of the input signal D.

However, a study done by the present inventors shows that the known flip-flop circuit has the following drawbacks. That is to say, in the known circuit shown in FIG. 13, if the input signal D is at the high level when the clock signal CK changes from the low level to the high level to cause the circuit to enter the evaluation phase, it is necessary to hold the ON state of the NMOS transistor MN1 for a certain period in addition to turning ON the NMOS transistors MN2 and MN3, in order to ensure the high-to-low transition of the signal at the node n1. Therefore, it is necessary to provide a delay circuit constituted by the inverter circuits INV1 and INV2 on a pass along which the clock signal CK is transmitted to the node CKD. The addition of the inverter circuits INV1 and INV2 increases the number of MOS transistors constituting the circuit accordingly, so that the layout area also increases. In the case of the configuration shown in FIG. 13, the flip-flop circuit is implemented with 25 MOS transistors.

In addition, when the clock signal CK changes from the low level to the high level with the input signal D at the high level as described above, the signal at the node n1 changes from the high level to the low level. However, in a subsequent period in which the clock signal CK changes from the high level to the low level to return to the initial state, the PMOS transistor MP1 turns ON and the NMOS transistor MN3 turns OFF, so that the signal at the node n1 is fixed at the high level. Therefore, fixing the signal at the node n1 at the high level does not depend on the operation of the NMOS transistor MN1. On the other hand, the output of the NAND circuit NAND1 changes from a high level to a low level and then, after a lapse of delay time of the delay circuit constituted by the inverter circuits INV1 and INV2, the output of the NAND circuit NAND1 rises back to the high level to unnecessarily turn OFF the NMOS transistor MN1. In this manner, the known circuit shown in FIG. 13 includes the circuit operation of unnecessary power consumption.

SUMMARY OF THE INVENTION

It is therefore an object of the present invention to provide a flip-flop circuit implemented with a small number of MOS transistors and exhibiting low power consumption. Another object of the present invention is to provide a flip-flop circuit operating at high speed while being implemented with the same number of transistors as a known circuit.

In order to solve the problems described above, according to the present invention, a SDFF circuit is configured without a delay circuit constituted by special inverter circuits INV1 and INV2, and unnecessary circuit operation in returning to an initial state is eliminated, thereby avoiding unnecessary power consumption with a minimum number of MOS transistors.

Specifically, a first inventive flip-flop circuit is characterized by including: an input terminal; a clock terminal; an output terminal; an input section for receiving a signal input to the input terminal and a clock signal at the clock terminal; a latch circuit for latching an output of the input section; a control section for controlling operation of the input section, the control section having a first node; and an output section for outputting a signal from the output terminal, wherein the input section has a second node, receives a signal at the first node of the control section as a control signal, outputs a high-level signal from the second node independently of the value of the input signal at the input terminal when the clock signal at the clock terminal is at a low level, and outputs, to the second node, a logic signal depending on the input signal at the input terminal when the clock signal at the clock terminal is at a high level and the control signal from the first node of the control section is at a high level, the latch circuit has a third node, receives a signal at the second node of the input section, holds the signal at the second node when the clock signal at the clock terminal is at the high level and the control signal from the first node of the control section is at a low level, and outputs, to the third node, a signal which is the logical inverse of the signal at the second node of the input section, the control section receives the clock signal at the clock terminal and the signal at third node of the latch circuit, outputs a high-level signal to the first node when the clock signal at the clock terminal is at the low level, and outputs, to the first node, a signal at the same level as that of the signal at the third node of the latch circuit with a delay corresponding to a predetermined delay value when the clock signal at the clock terminal is at the high level, and the output section receives the signal at the first node of the control section and the signal at the third node of the latch circuit, holds the signal at the output terminal when the signal at the first node of the control section is at the high level and the signal at the third node of the latch circuit is at a low level, outputs, to the output terminal, a logic signal depending on the signal at the first node when the signal at the first node of the control section is at the low level, and outputs a logic signal depending on the signal at the third node when the signal at the third node is at a high level.

A second inventive flip-flop circuit is characterized by including: an input terminal; a clock terminal; an output terminal; an input section for receiving a signal input to the input terminal and a clock signal at the clock terminal; a latch circuit for latching an output of the input section; a control section for controlling operation of the input section, the control section having a first node; and an output section for outputting a signal from the output terminal, wherein the input section has a second node, receives a signal at the first node of the control section as a control signal, outputs a high-level signal from the second node independently of the value of the input signal at the input terminal when the clock signal at the clock terminal is at a low level, and outputs, to the second node, a logic signal depending on the input signal at the input terminal when the clock signal at the clock terminal is at a high level and the control signal from the first node of the control section is at a high level, the latch circuit has a third node, receives a signal at the second node of the input section, holds the signal at the second node when the clock signal at the clock terminal is at the high level and the control signal from the first node of the control section is at a low level, and outputs, to the third node, a signal which is the logical inverse of the signal at the second node of the input section, the control section receives the clock signal at the clock terminal and the signal at third node of the latch circuit, outputs a high-level signal to the first node when the clock signal at the clock terminal is at the low level, and outputs, to the first node, a signal at the same level as that of the signal at the third node of the latch circuit with a delay corresponding to a predetermined delay value when the clock signal at the clock terminal is at the high level, and the output section holds the signal at the output terminal when a low-level signal is applied to the clock terminal, while outputting, to the output terminal, a logic signal depending on the signal at the second node when a high-level signal is applied to the clock terminal.

The first inventive flip-flop circuit is characterized in that the control section includes a delay circuit for delaying the control signal to be output to the input section.

The second inventive flip-flop circuit is characterized in that the control section includes a delay circuit for delaying the control signal to be output to the input section.

The first inventive flip-flop circuit is characterized in that the latch circuit includes first shut-off means for shutting off a path for current supply to the second node of the input section when the signal at the first node of the control section is at the high level and the signal at the third node of the latch circuit is at the low level.

The second inventive flip-flop circuit is characterized in that the latch circuit includes first shut-off means for shutting off a path for current supply to the second node of the input section when the signal at the first node of the control section is at the high level and the signal at the third node of the latch circuit is at the low level.

The first inventive flip-flop circuit is characterized in that the output section includes second shut-off means for shutting off a transmission of a low-level signal, which temporally appears at the first node of the control section, to the output terminal when the signal at the second node of the latch circuit is at a low level.

The second inventive flip-flop circuit is characterized in that the output section includes second shut-off means for shutting off a transmission of a low-level signal, which temporally appears at the first node of the control section, to the output terminal when the signal at the second node of the latch circuit is at a low level.

The first inventive flip-flop circuit is characterized in that the output section includes a PMOS transistor having a gate terminal connected to the second node, a source connected to a power supply and a drain connected to the output terminal.

The second inventive flip-flop circuit is characterized in that the output section includes a PMOS transistor having a gate terminal connected to the second node, a source connected to a power supply and a drain connected to the output terminal.

In one aspect of the present invention, the latch circuit connected to the second node (output node) of the input section is used such that the third node (output node) of the latch circuit is connected to an input terminal of the control section. Accordingly, a portion of the known circuit shown in FIG. 13 constituted by the two inverter circuits INV1 and INV2 and the NAND circuit NAND1 is simplified, thus reducing the number of MOS transistors and the layout area. As a result, power consumption is reduced.

In addition, the control section receives the clock signal at the clock terminal and the signal at the third node of the latch circuit to output a high-level signal to the first node when the clock signal at the clock terminal is at the low level, while outputting, to the first node, a high-level signal which is at the same level as the signal at the third node of the latch circuit when the clock signal at the clock terminal is at the high level and the input signal is at a high level. Accordingly, if the input signal is at the high level, the inventive flip-flop circuit can fix the signal at the first node at a high level independently of the low-to-high transition of the clock signal or the reverse transition thereof, thereby avoiding unnecessary change of the level of the control signal. As a result, unnecessary power consumption is reduced.

Further, in another aspect of the present invention, two signals to be input to the output section differ from those in the above aspect, and the circuit function of the output section is maintained with the different circuit configuration of the output section. Accordingly, the power consumption is reduced by simplifying the control section as in the above aspect of the present invention, while using another variation of the output section.

Moreover, according to the present invention, the delay circuit is provided on a transmission path of the control signal from the first node of the control section to the input section. This delay circuit allows an appropriate delay time in transmission of the output signal of the control section to the input section. As a result, the circuit operation is stabilized easily.

According to the present invention, when the signal at the first node is at the high level and the signal at the third node is at the low level, it is possible to prevent the latch circuit from interfering with a change of the signal at the second node. Accordingly, the signal at the second node is changed from a high level to a low level for a shorter time, thus further increasing the speed of the flip-flop circuit.

In the inventive flip-flop circuit described above, in a period in which a high-level signal is applied to the input terminal and the signal at the clock terminal is changed from the low level to the high level, even when a glitch in which the potential at the first node decreases temporally and then rises back to the high level is generated, the second shut-off means prevents the glitch from being output to the output terminal.

According to the present invention, when the signal at the second node is changed from the high level to the low level, the potential at the output terminal can be changed to a high level at high speed. Accordingly, it is possible to prevent a glitch generated in the inside from being transmitted to an output signal. In addition, it is also possible to further increase the speed of the flip-flop circuit.

DESCRIPTION OF THE PREFERRED EMBODIMENTS

Hereinafter, flip-flop circuits according to embodiments of the present invention will be described with reference to the drawings.

Embodiment 1

Figure 1:
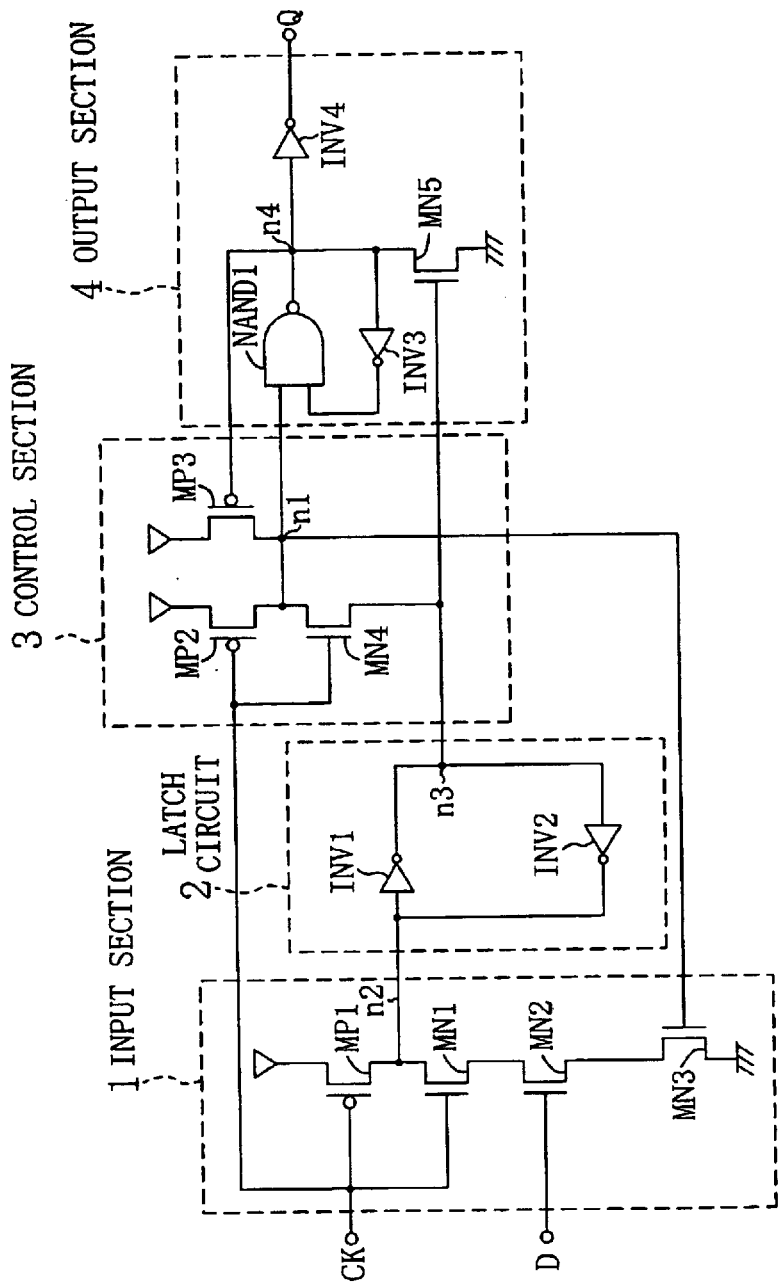
FIG. 1 is a circuit diagram showing a flip-flop circuit according to a first embodiment of the present invention.

FIG. 1 shows a circuit configuration of a flip-flop circuit according to a first embodiment of the present invention. In FIG. 1, reference sign D denotes an input terminal, reference sign CK denotes a clock terminal, reference sign Q denotes an output terminal, reference numeral 1 denotes an input section of a dynamic type, reference numeral 2 denotes a latch circuit, reference numeral 3 denotes a control section, and reference numeral 4 denotes an output section of a static type.

The control section 3 includes a first node n1, which controls operation of the input section 1 using a signal at the first node n1 as a control signal. The input section 1 includes a second node n2, receives a clock signal at the clock terminal CK (hereinafter, simply referred to as a clock signal CK) and an input signal at the input terminal D (hereinafter, simply referred to as an input signal D) to output a signal from the second node n2. The latch circuit 2 includes a third node n3, receives and latches the signal output from the second node n2 of the input section 1, and outputs the latched signal from the third node n3. The output section 4 receives the signal output from the latch circuit 2 and the signal output from the control circuit 3 to output a signal to the output terminal Q.

Specifically, the input section 1 includes a PMOS transistor MP1 and three NMOS transistors MN1, MN2 and MN3. The PMOS transistor MP1 and the three NMOS transistors MN1, MN2 and MN3 are connected in series such that the source of the PMOS transistor MP1 is connected to a power source and the source of the NMOS transistor MN3 is connected to a ground. The drain of the PMOS transistor MP1 and the drain of the NMOS transistor MN1 are connected to each other at a connection point, which is the second node n2. In this circuit configuration, when the clock signal CK is at a low level, the PMOS transistor MP1 turns ON and the NMOS transistor MN1 turns OFF so that the input section 1 outputs a high-level signal from the second node n2, independently of the value of the input signal D. On the other hand, in a case where the clock signal CK is at a high level and the signal (control signal) at the first node n1 of the control section 3 is at a high level, the NMOS transistors MN1 and MN3 turn ON, so that the input section 1 changes the signal at the second node n2 to a low level when the input signal D is at a high level, while changing the signal at the second node n2 to a high level when the input signal D is at a low level. That is to say, in this case, a signal having a value depending on the input signal D and obtained by logical inversion of the input signal D is output from the node n2. In addition, if the clock signal CK is at the high level and the signal at the node n1 is at a low level, the PMOS transistor MP1 and the NMOS transistor MN3 turn OFF, so that the signal level at the second node n2 is held by the latch circuit 2.

The latch circuit 2 includes two inverter circuits INV1 and INV2. The inverter circuit INV1 has an output terminal connected to an input terminal of the inverter circuit INV2, and the inverter circuit INV2 has an output terminal connected to an input terminal of the inverter circuit INV1. The input terminal of the inverter circuit INV1 of the latch circuit 2 is connected to the second node n2 as an output terminal of the input section 1. The output terminal of the inverter circuit INV1 serves as the third node n3. In this circuit configuration, the inverter circuit INV1 performs logical inversion on the signal at the second node n2 of the input section 1 and outputs the resultant signal to the third node n3.

The control circuit 3 includes two PMOS transistors MP2 and MP3 and the NMOS transistor MN4. In the control circuit 3, the PMOS transistor MP2 and the NMOS transistor MN4 are connected in series such that the source of the PMOS transistor MP2 is connected to a power source and the source of the NMOS transistor MN4 is connected to the third node n3. The gate of the PMOS transistor MP2 is connected to the gate of the NMOS transistor MN4 at a connection point connected to the clock terminal CK. The drain of the PMOS transistor MP2 serving as an output terminal of the control section 3 is connected to the drain of the NMOS transistor MN4 at a connection point connected to the first node n1. A signal at the first node n1 is input to the gate of the NMOS transistor MN3 of the input section 1 as the control signal. The source of the PMOS transistor MP3 is connected to a power source and the drain thereof is connected to the first node n1.

When the clock signal CK is at the low level, the PMOS transistor MP2 turns ON and the NMOS transistor MN4 turns OFF, so that the control section 3 with such a configuration as described above outputs a high-level signal from the first node n1. On the other hand, when the clock signal CK is at the high level, the PMOS transistor MP2 turns OFF and the NMOS transistor MN4 turns ON, so that a signal at the third node n3 of the latch circuit 2 is transmitted to the first node n1 via the NMOS transistor MN4, and a signal at the same level as that at the third node n3 of the latch circuit 2 is output to the first node n1. At this time, the signal at the third node n3 of the latch circuit 2 is transmitted to the first node n1 with a delay corresponding to a period during which the first node n1 are charged and discharged by the NMOS transistor MN4. As will be described later, the PMOS transistor MP3 is provided in order to keep the signal at the first node n1 at the high level and to delay the transmission of the low-level signal at the third node n3 of the latch circuit 2 to the first node n1 when a high-level signal is applied to the third node n3 of the latch circuit 2.

The output section 4 includes a NAND circuit NAND1, two inverter circuits INV3 and INV4 and an NMOS transistor MN5. The NAND circuit NAND1 has two input terminals, one of which is connected to the first node n1 of the control section 3, and the other of which is connected to an output terminal of the inverter circuit INV3. The NAND circuit NAND1 has an output terminal connected to an input terminal of the inverter circuit INV3 at a connection point, which is a fourth node n4. The fourth node n4 is connected to the gate of the PMOS transistor MP3 of the control section 3, to an input terminal of the inverter circuit INV4 and to the drain of the NMOS transistor MN5. The NMOS transistor MN5 has a source connected to a ground and a gate connected to the third node n3 of the latch circuit 2. In the output section 4 with such a circuit configuration, when the signal at the third node n3 of the latch circuit 2 is at a low level and the signal at the first node n1 of the control section 3 is at the high level, the NMOS transistor MN5 is OFF. Accordingly, the value of the output at the output terminal Q (hereinafter, simply referred to as an output signal Q) is held by the NAND circuit NAND1 and the inverter circuit INV3. When the signal at the third node n3 of the latch circuit 2 is at a high level and the signal at the first node n1 of the control section 3 is at the high level, the NMOS transistor MN5 is ON. Accordingly, a signal at the fourth node n4 changes to a low level, thereby outputting a high-level signal to the output terminal Q. When the signal at the third node n3 of the latch circuit 2 is at the low level and the signal at the first node n1 of the control section 3 is at the low level, the NMOS transistor MN5 is OFF and the low-level signal at the first node n1 of the control section 3 is input to the NAND circuit NAND1. Accordingly, a high-level signal is output to the fourth node n4 and a low-level signal is output to the output terminal Q.

Figure 2:
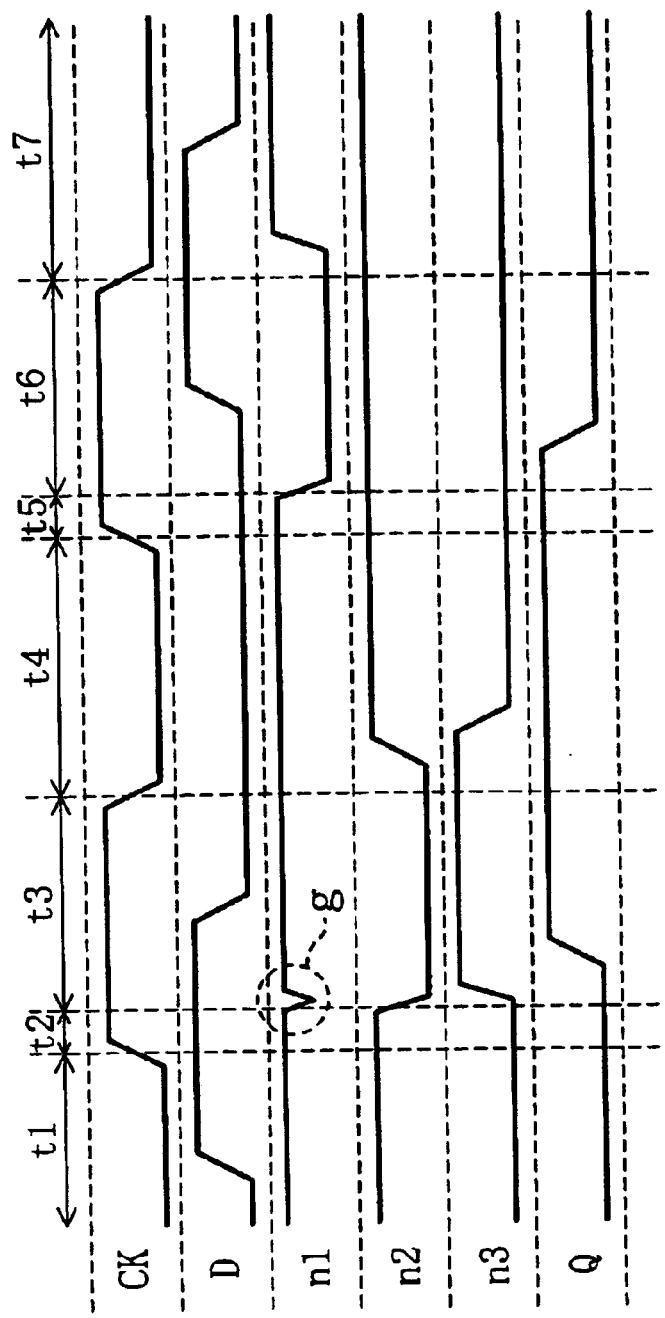
FIG. 2 is a timing chart showing operation of the flip-flop circuit in FIG. 1.

FIG. 2 is a timing chart showing how the flip-flop circuit shown in FIG. 1 operates. Hereinafter, operation of the flip-flop circuit shown in FIG. 1 will be described with reference to FIG. 2.

In FIG. 1, during periods in which the clock signal CK is at the low level (periods t1, t4 and t7 in FIG. 2), the signals at the second node n2 of the input section 1 and at the first node n1 of the control section 3 are set at the high levels by the PMOS transistors MP1 and MP2, respectively. At this time, the signal at the third node n3 is at the low level and is the logical inverse of the signal at the second node n2. Therefore, the NMOS transistor MN5 of the output section 4 is OFF and the value of the output signal Q is held by the NAND circuit NAND1 and the inverter circuit INV3.

Next, if the input signal D is at the high level during the transition of the clock signal CK from the low level to the high level (in period t2 in FIG. 2), all the NMOS transistors MN1, MN2 and MN3 turn ON, and the second node n2 of the input section 1 is discharged so that the signal at the second node n2 changes to the low level. At this time, the signal at the third node n3 changes to the high level in accordance with the transition of the signal at the second node n2 to the low level. Accordingly, the NMOS transistor MN5 of the output section 4 turns ON so that the signal at the fourth node n4 of the output section 4 changes to the low level. Then, the inverter circuit INV4 performs logical inversion on the signal at the fourth node n4, so that the output signal Q changes to a high level. Since the NMOS transistor MN4 of the control section 3 turns ON in accordance with the low-to-high transition of the clock signal CK, the signal at the first node n1 starts a transition from the high level to the low level at which the signal at the third node n3 is, for a first period. However, when the signal at the node n3 changes to the high level, this transition to the low level stops (and a waveform generated at this time is referred to as a glitch). This glitch generated at the first node n1 is represented as reference sign g in FIG. 2. At this time, the potential at the first node n1 decreases from the high level by the threshold voltage of the NMOS transistor MN4. However, when the signal at the fourth node n4 changes to the low level, the PMOS transistor MP3 turns ON so that the potential at the first node n1 rises to the high level.

Next, even in a case where the input signal D changes from the high level to the low level in a period in which the signal at the second node n2 has changed to the low level and the clock signal CK is at the high level (period t3 in FIG. 2), the signals at the nodes n2 and n3 at both ends of the latch circuit 2 are held by the latch circuit 2. In this manner, the signal at the output node of the latch circuit 2 (the third node n3) changes to the high level and, after the level of the output signal Q has changed to the high level after a lapse of a certain delay time, the level of the output signal Q is held, independently of the change of the input signal D.

On the other hand, in a case where the input signal D at the low level during the transition of the clock signal CK from the low level to the high level (period t5 in FIG. 2), the NMOS transistor MN2 of the input section 1 is OFF, so that the signal at the second node n2 is kept at the high level. Accordingly, the signal at the third node n3 of the latch circuit 2 is also kept at the low level. In this manner, the first node n1 is discharged through NMOS transistor MN4 in the ON state, and the signal at the node n1 changes to the same level as the level at the third node n3 so that the signal at the first node n1 of the control section 3 changes from the high level to the low level. At this time, in the output section 4, the low-level signal at the first node n1 of the control section 3 is input to the NAND circuit NAND1 so that the signal at the fourth node n4 changes to the high level and the output signal Q changes to a low level.

As described above, in period t6 in FIG. 2 in which the signal at the first node n1 of the control section 3 has changed to the low level and the clock signal CK is at the high level, even when the input signal D changes from the low level to the high level, the second node n2 of the latch circuit 2 is not discharged and the signal at the second node n2 is kept at the high level because the NMOS transistor MN3 of the input section 1 is OFF in accordance with the low-level control signal at the first node n1 of the control section 3. Accordingly, the level of the input signal to the output section 4 (the signal at the first node n1 of the control section 3) and the level of the signal at the third node n3 of the latch circuit 2 do not change. As a result, the low-level output at the output terminal Q is held without change, independently of the change of the input signal D.

It should be noted in this embodiment that if the signal at the first node n1 changes from the high level to the low level before the complete transition of the signal at the second node n2 to the low level in a period in which the clock signal CK changes from the low level to the high level and the input signal D is at the high level; the signal at the second node n2 can not change to the low level or changes at low speed. If the high-to-low transition of the signal at the first node n1 is too slow, delay time between the transition of the clock signal CK to the transition of the output signal Q increases in a period in which the clock signal CK changes from the low level to the high level and the input signal D is at the low level. Accordingly, the current driving ability of the NMOS transistor MN4 of the control section 3 is appropriately adjusted in order to optimize the delay time from the third node n3 to the first node n1. If the glitch waveform g generated at the first node n1 decreases to a voltage lower than the logical threshold value of the NAND circuit NAND1 of the output section 4, glitches are generated also at the fourth node n4 and the output terminal Q, resulting in high power consumption. Accordingly, the size of the PMOS transistor MP3 and the NMOS transistor MN4 of the control section 3 and the like are appropriately adjusted in order to prevent the lowest potential of the glitch waveform g generated at the first node n1 from decreasing to a voltage lower than the logical threshold value of the NAND circuit NAND1. That is to say, in this embodiment, the size of the PMOS transistor MP3 is made larger and the size of the NMOS transistor MN4 is made smaller, thus suppressing the amplitude of the glitch waveform g.

Figure 13:
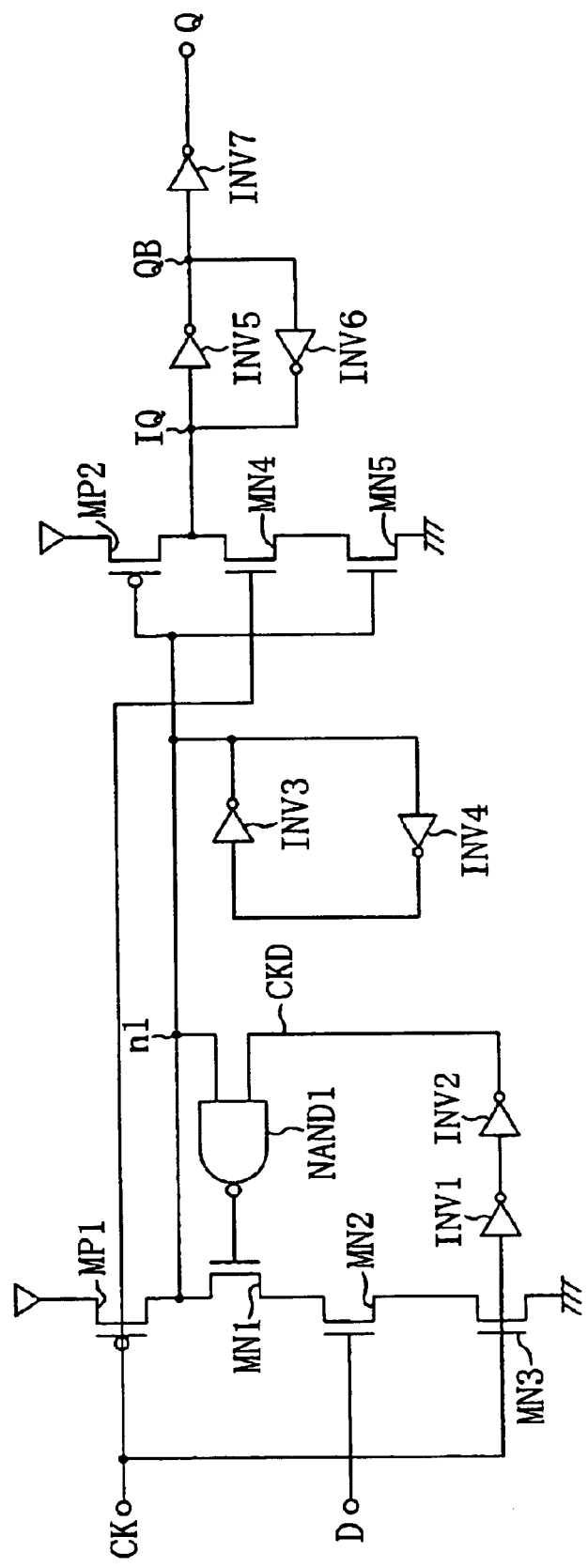
FIG. 13 is a circuit diagram showing a known flip-flop circuit.

Now, the known circuit shown in FIG. 13 and this embodiment will be compared. In the known circuit, when the clock signal CK changes from the low level to the high level and the input signal D is at the high level, the PMOS transistor MP1 turns OFF and all the three NMOS transistors MN1, MN2 and MN3 turn ON. Accordingly, the signal at the first node n1 changes to the low level, and then the delay circuit constituted by the inverter circuits INV1 and INV2 changes the level at the node CKD from low to high. At this time, it is necessary to keep the NMOS transistor MN1 in the ON state in addition to turning ON the NMOS transistors MN2 and MN3, in order to ensure the transition of the signal at the node n1 to the low level. To attain this, the delay circuit constituted by the inverter circuits INV1 and INV2 needs to be provided on a path for transmitting the clock signal CK to the node CKD.

In the circuit shown in FIG. 1 of this embodiment, when the clock signal CK changes from the low level to the high level and the input signal D is at the high level, the PMOS transistor MP1 turns OFF and all the three NMOS transistors MN1, MN2 and MN3 turn ON. Accordingly, the signal at the second node n2 in FIG. 1 corresponding to the node n1 in FIG. 13 changes to the low level in the same manner as in the known circuit. However, the signal level at the first node n1 in FIG. 1 corresponding to the output node of the NAND circuit NAND1 in FIG. 13 is kept at high upon receiving the high-level signal at the third node n3 via the NMOS transistor MN4 in the ON state.

As a result, the circuit of this embodiment can keep the NMOS transistor MN3 in FIG. 1 corresponding to the NMOS transistor MN1 in FIG. 13 in the ON state without using the inverter circuits INV1 and INV2 of the known circuit in FIG. 13.

As described above, in the circuit of this embodiment, the flip-flop circuit is configured with twenty MOS transistors—five fewer by comparison with the known circuit shown in FIG. 13. In addition, the configuration with fewer MOS transistors reduces the number of transistors under operation accordingly as well as reduces parasitic capacitance, resulting in lower power consumption.

Moreover, since only the latch circuit 2 is a load connected to the second node n2 of the input section 1, the load can be set smaller than in the case where the PMOS transistor MP2, the NMOS transistor MN5, the inverter circuits INV3 and INV4 constituting the latch circuit, the NAND circuit NAND1 and the like are connected to the first node n1 in the known circuit shown in FIG. 13 corresponding to the second node n2. Accordingly, the input section 1 can be operated at higher speed, resulting in increase of operation speed of the flip-flop circuit.

Embodiment 2

Hereinafter, a flip-flop circuit according to a second embodiment of the present invention will be described with reference to FIG. 3. In this embodiment, each component having the same function as the counterpart in the first embodiment is identified by the same reference numeral and the description thereof will be omitted herein.

Figure 3:
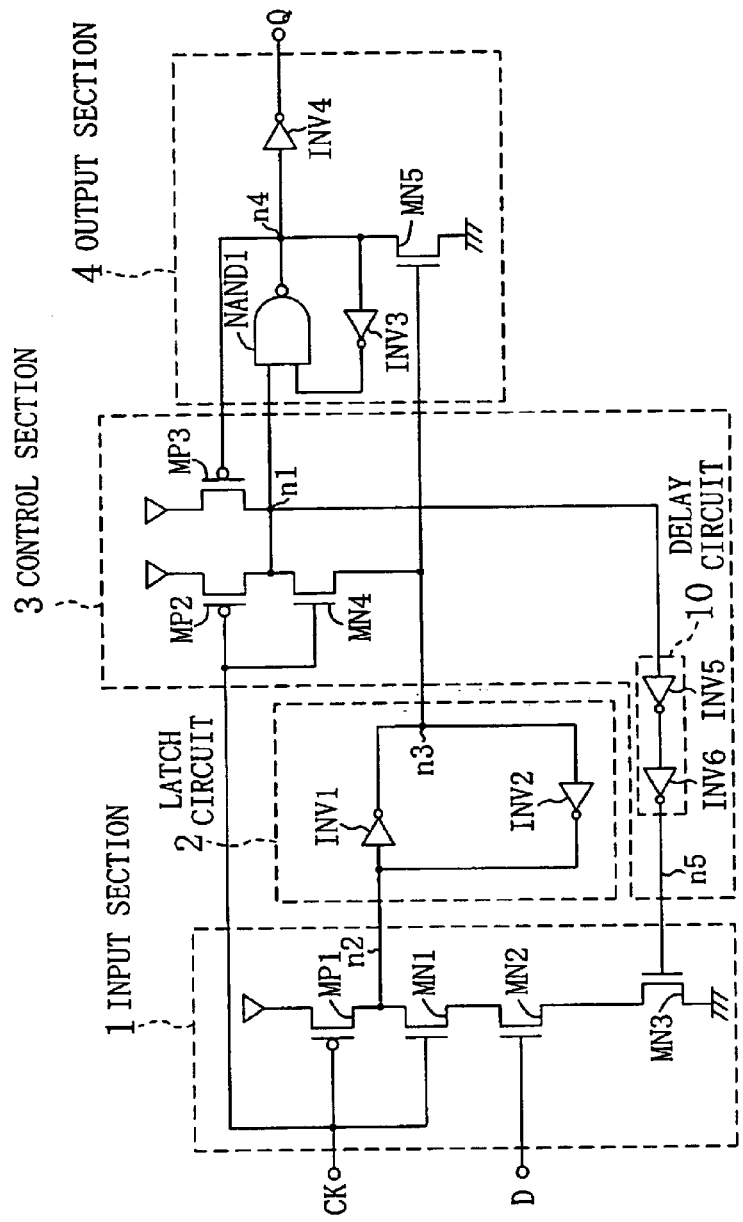
FIG. 3 is a circuit diagram showing a flip-flop circuit according to a second embodiment of the present invention.

The flip-flop circuit shown in FIG. 3 has substantially the same configuration as that of the circuit of the first embodiment shown in FIG. 1 except for a delay circuit 10 added to a control section 3. That is to say, in the circuit shown in FIG. 3, a control signal at a first node n1 is applied to the gate of an NMOS transistor MN3 in an input section 1 via the delay circuit 10 constituted by two inverter circuits INV5 and INV6 connected in series, for the purpose of delaying the control signal applied from the first node n1 to the gate of the NMOS transistor MN3. The inverter circuit INV6 has an output terminal connected to the gate of the NMOS transistor MN3 of the input section 1 at a connection point, which is a fifth node n5.

With this configuration of this embodiment, in a case where a delay time between a change of the potential at a third node n3 of a latch circuit 2 and a change of the potential at the first node n1 of the control section 3 is short, and in a state in which a clock signal CK has changed from a low level to a high level and an input signal D is at a high level, even if a signal at the first node n1 of the control section 3 changes from a high level to a low level before a change of the potential at a second node n2 of the input section 1 to a low level, a signal at the fifth node n5 of the control section 3 is kept at a high level for a predetermined period, thus ensuring a change of a signal at the second node n2 of the input section 1 to the low level. In addition, in the circuit of this embodiment, it is possible to prevent a delay time between the transition of the clock signal CK and a transition of an output signal Q from increasing when the clock signal CK changes from the low level to the high level and the input signal D is at the low level.

The inverter circuits INV5 and INV6 operate only when the signal level at the first node n1 of the control signal 3 changes. Specifically, the inverter circuits INV5 and INV6 operate only when the clock signal CK is at the low level, when the clock signal CK changes from the low level to the high level with a low-level signal applied to the input signal D, or when the clock signal CK further changes from the high level to the low level in that state. Accordingly, power consumption is reduced, as compared to the known circuit shown in FIG. 13 in which the inverter circuits INV1 and INV2 operate every time the clock signal changes.

As described above, in this embodiment, the flip-flop circuit can be implemented with 24 MOS transistors—one fewer by comparison with the known circuit shown in FIG. 13, and power consumption is reduced as compared to the known circuit shown in FIG. 13.

Embodiment 3

Hereinafter, a flip-flop circuit according to a third embodiment of the present invention will be described with reference to drawings.

Figure 4:
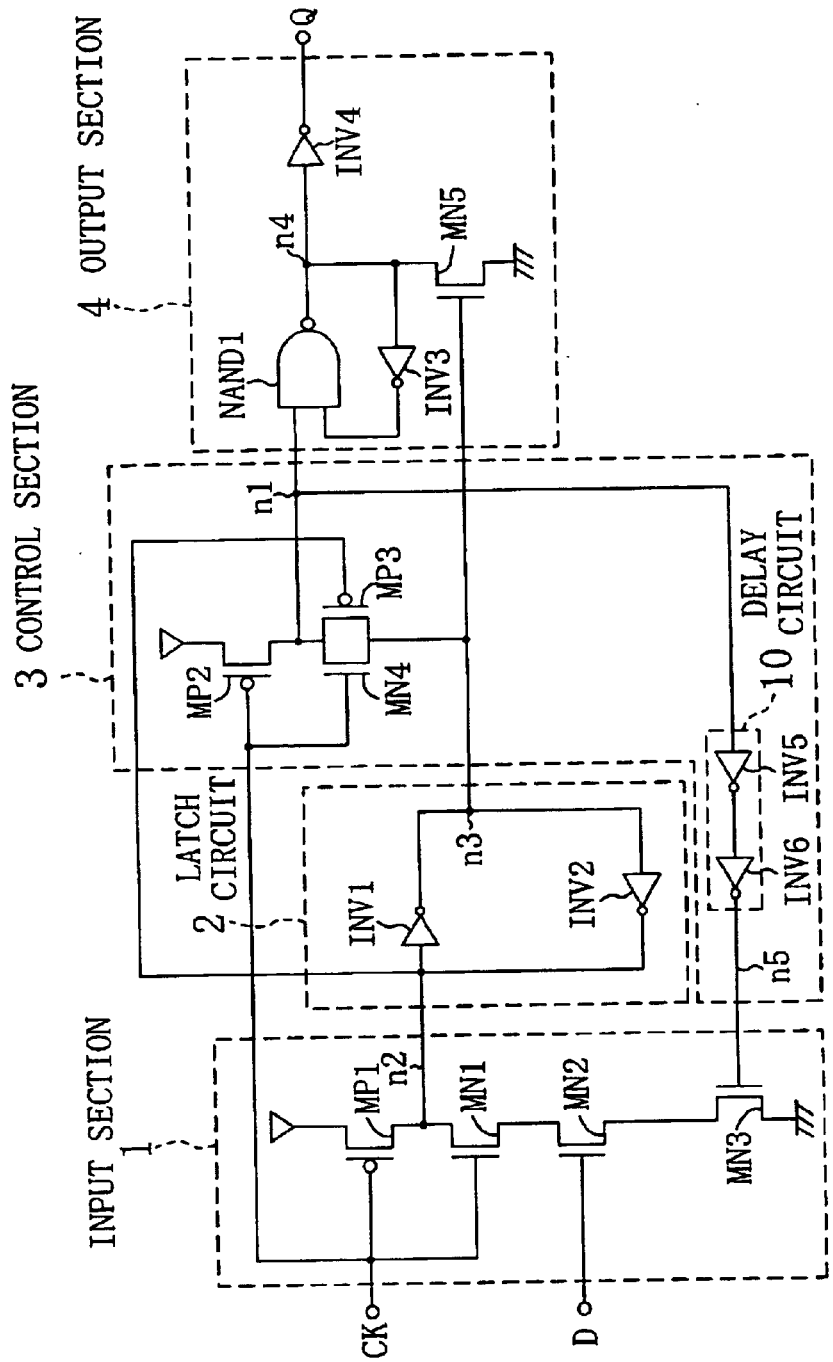
FIG. 4 is a circuit diagram showing a flip-flop circuit according to a third embodiment of the present invention

FIG. 4 is a circuit diagram showing the flip-flop circuit of this embodiment. The configuration thereof is basically the same as the flip-flop circuit shown in FIG. 3 but is different from the circuit shown in FIG. 3 in changing the position of the PMOS transistor MP3 of the second embodiment shown in FIG. 3. Specifically, in this embodiment, the PMOS transistor MP3, which has a gate connected to the fourth node n4 and is provided between the power source and the first node n1 in FIG. 3, has a gate connected to a second node n2 of an input section 1 and is connected to an NMOS transistor MN4 in parallel to be used for pulling up the first node n1 to a power supply voltage.

The flip-flop circuit of this embodiment shown in FIG. 4 still has the same function of the flip-flop circuit in FIG. 3 and, in addition, can reduce a delay time, which occurs more than necessary in the known circuit, when an input signal D is at a low level and a clock signal CK changes from a low level to a high level, i.e., when a high-level potential at a first node n1 should quickly change to a low level, at which the potential at a third node n3 is. Hereinafter, this operation will be described in detail.

In the case of the flip-flop circuit in FIG. 3, when the input signal D is at the low level and the clock signal CK changes from the low level to the high level, the potential at the third node n3 of the latch circuit 2 is at a low level and the NMOS transistor MN4 turns ON, so that the potential at the first node n1 of the control section 3 changes to the low level at which potential at the third node n3 is. At this time, if the potential at the fourth node n4 is at a low level, the PMOS transistor MP3 is ON and the potential at the first node n1 is fixed at the high level. With the transition of the clock signal CK to the high level, the NMOS transistor MN4, which has higher current driving ability than the PMOS transistor MP3, turns ON, thereby starting a discharge at the first node n1. Subsequently, the potential at the first node n1 falls to the logical threshold value of the NAND circuit NAND1 or less, so that the value held by the NAND circuit NAND1 and the inverter circuit INV3 changes to a value which is logically reversed. As a result, the signal at the fourth node n4 changes to a high level, so that the PMOS transistor MP3 turns OFF. At this time, current supply from the power supply to the first node n1 stops, thereby accelerating the transition of the potential at the first node n1 to the low level. Accordingly, the circuit shown in FIG. 3 has a drawback that the PMOS transistor MP3 supplies current to the first node n1 in an initial stage of the transition of the potential at the first node n1 to the low level so that a delay is caused.

On the other hand, in the case of the flip-flop circuit of this embodiment shown in FIG. 4, the PMOS transistor MP3 is not connected to a power supply. Accordingly, when the input signal D is at the low level and the clock signal CK changes from the low level to the high level, a PMOS transistor MP2 is OFF, as in the flip-flop circuit of the second embodiment shown in FIG. 3, so that no current is supplied from the power source to the first node via the PMOS transistor MP2. Since the PMOS transistor MP3 has a transmission gate structure whose both ends are connected to the NMOS transistor MN4 in parallel, no current is supplied from the power supply to the first node n1 via the PMOS transistor MP3. Accordingly, the PMOS transistor MP3 does not affect the transition of the potential at the first node n1 to the low level. In this manner, the transition to the low level is performed at higher speed than in the circuit shown in FIG. 3. That is to say, when the input signal is at the low level and the clock signal changes from the low level to the high level, the PMOS transistor MP3 shuts off current supply from the power source to the first node n1.

As described above, in this embodiment, the flip-flop circuit can be implemented with 24 MOS transistors—one fewer by comparison with the known circuit shown in FIG. 13. In addition, since there is no unnecessary current supply from the PMOS transistor MP3, and power consumption is reduced as compared to the flip-flop circuit of the first and the second embodiment shown in FIG. 1 and FIG. 3. Since there is no power supply from the PMOS transistor MP3, the transition of the potential at the first node n1 is performed at higher speed, so that the flip-flop circuit of this embodiment can be operated at higher speed than the flip-flop circuit of the second embodiment shown in FIG. 3.

Embodiment 4

Figure 5:
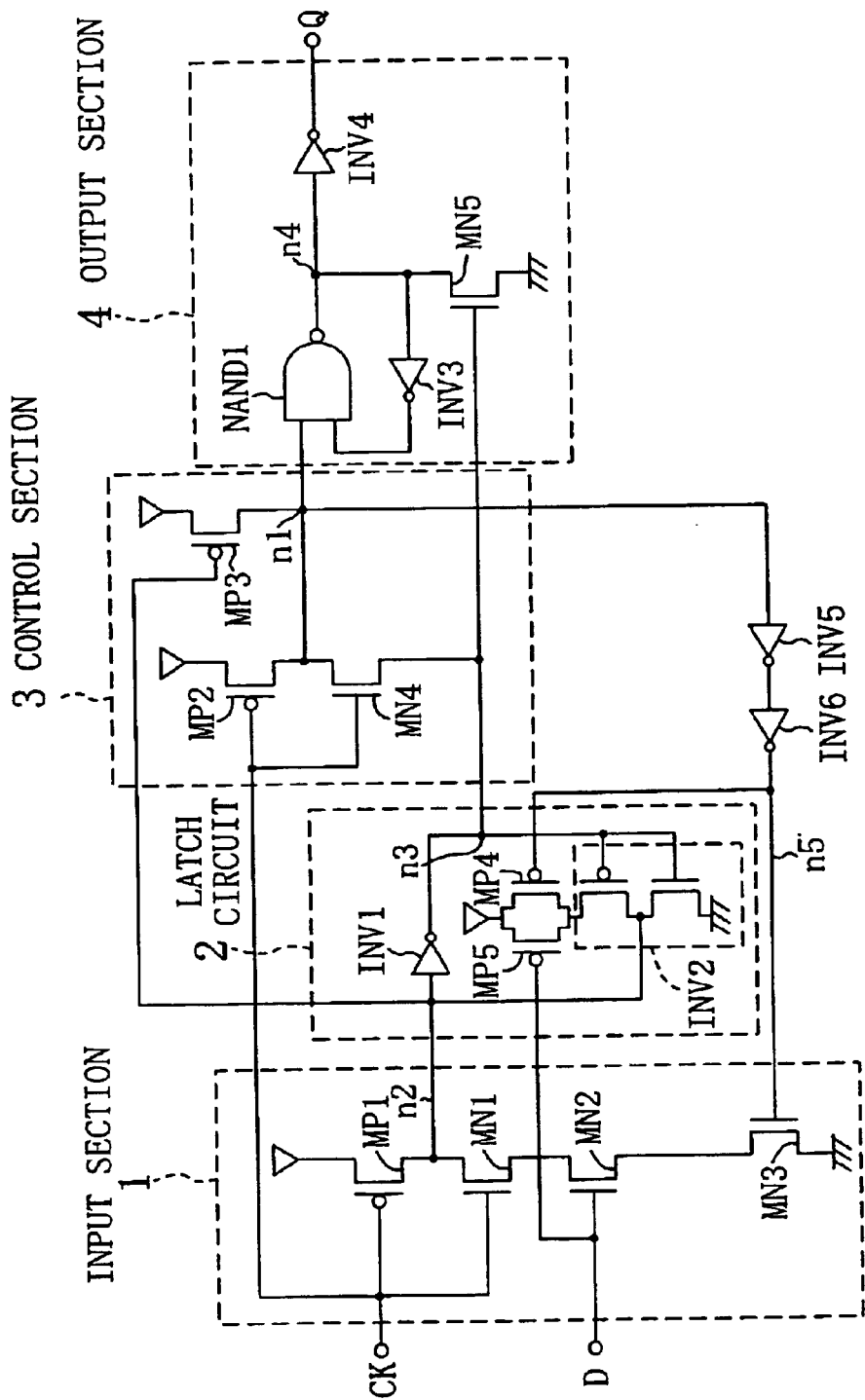
FIG. 5 is a circuit diagram showing a flip-flop circuit according to a fourth embodiment of the present invention

A flip-flop circuit according to another embodiment of the present invention is shown in FIG. 5. The configuration thereof is basically the same as that of the flip-flop circuit shown in FIG. 3 except for parts as shown below. That is to say, in this flip-flop circuit, a PMOS transistor MP3 for raising the potential at a node n1 to a high level has a gate connected to a node n2, and a source connected to a power source. The flip-flop circuit further includes PMOS transistors MP4 and MP5 for shutting off power applied to an inverter INV2 when the signal at a node n5 is at a high level and an input signal D is at a high level.

When the input signal D is at a high level and a clock signal CK rises, both the signals at the nodes n2 and n4 transition from a high level to a low level and the output signal Q transitions from a low level to a high level. In this case, signal transition at the node n2 precedes signal transition at the node n4. Since the gate of the PMOS transistor MP3 is connected to the node n2 rather than the node n4, the glitch waveform generated at the node n1 as described before can be reduced. Furthermore, in this case, both the PMOS transistors MP4 and MP5 are turned OFF so that power applied to the inverter circuit INV2 is shut off. Therefore, no signal collision occurs on transition of the signal at the node n2 from high level to low level, resulting in increased transition speed of the signal at the node n2.

As described so far, in this embodiment, glitch can be reduced and signal transition can be performed at higher speed, although the number of MOS transistors constituting the flip-flop circuit is increased by two as compared with the circuit configuration shown in FIG. 4.

Figure 6:
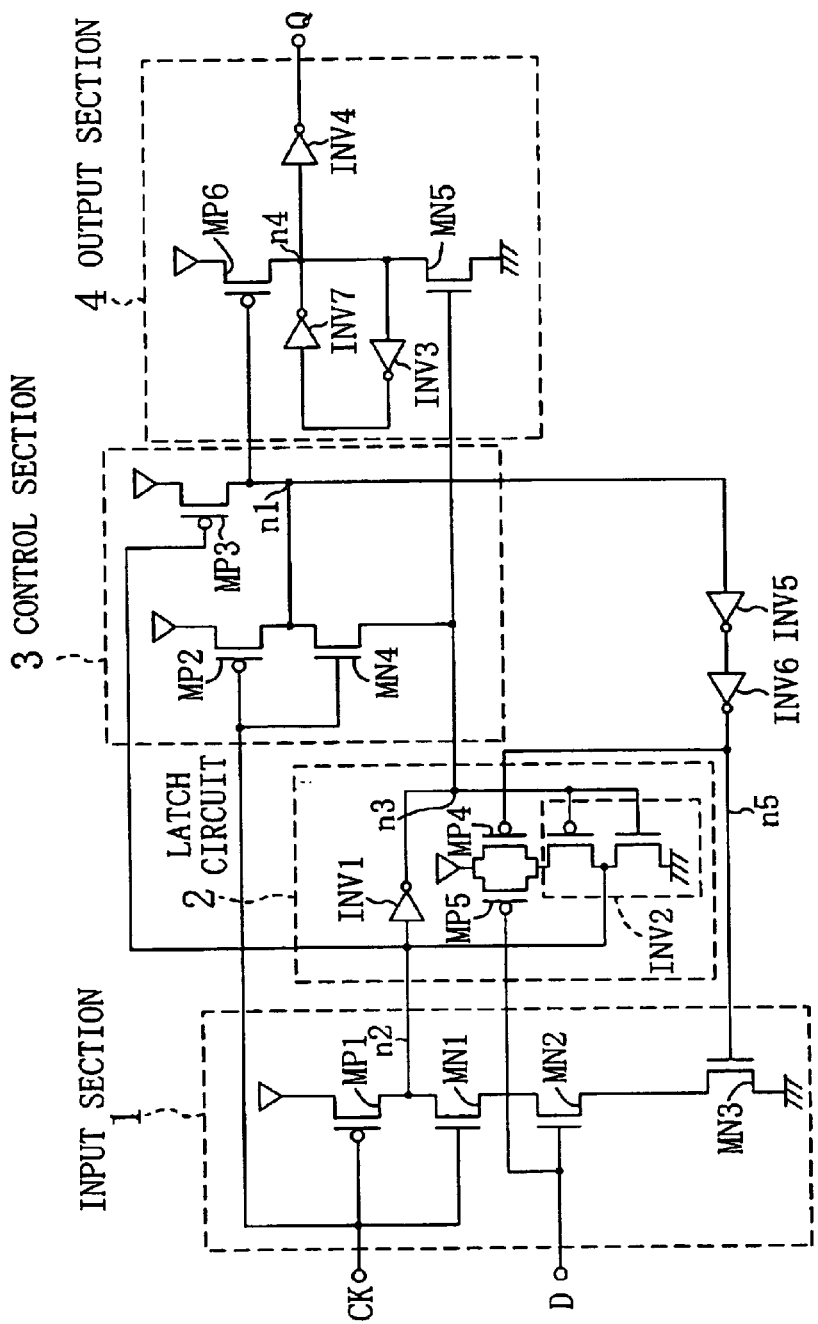
FIG. 6 is a circuit diagram showing a flip-flop circuit according to a fourth embodiment of the present invention

FIG. 6 shows a diagram of another flip-flop circuit in which an output section 4 has a different configuration from those in the circuits shown in FIGS. 1, 3, 4 and 5. This flip-flop circuit includes a PMOS transistor MP6 and an inverter circuit INV7, instead of the NAND circuit NAND1. In this flip-flop circuit, the gate of the PMOS transistor MP6 is connected to the node n1 and inserted between a power source and the node n4. The inverter circuit INV7 is connected at its output terminal to the node n4 and connected at its input terminal to the output terminal of the inverter circuit INV3. The output section 4 of this flip-flop circuit can be configured using MOS transistors one less in number than those of the output sections 4 shown in FIGS. 1, 3 and 4. In this case, at both the rising and falling of the signal at the node n4, the signal collides with the output of the inverter circuit INV7. Therefore, it is necessary to make the current driving abilities of the PMOS transistor MP6 and the NMOS transistor MN5 sufficiently higher than that of the inverter circuit INV7.

Figure 7:
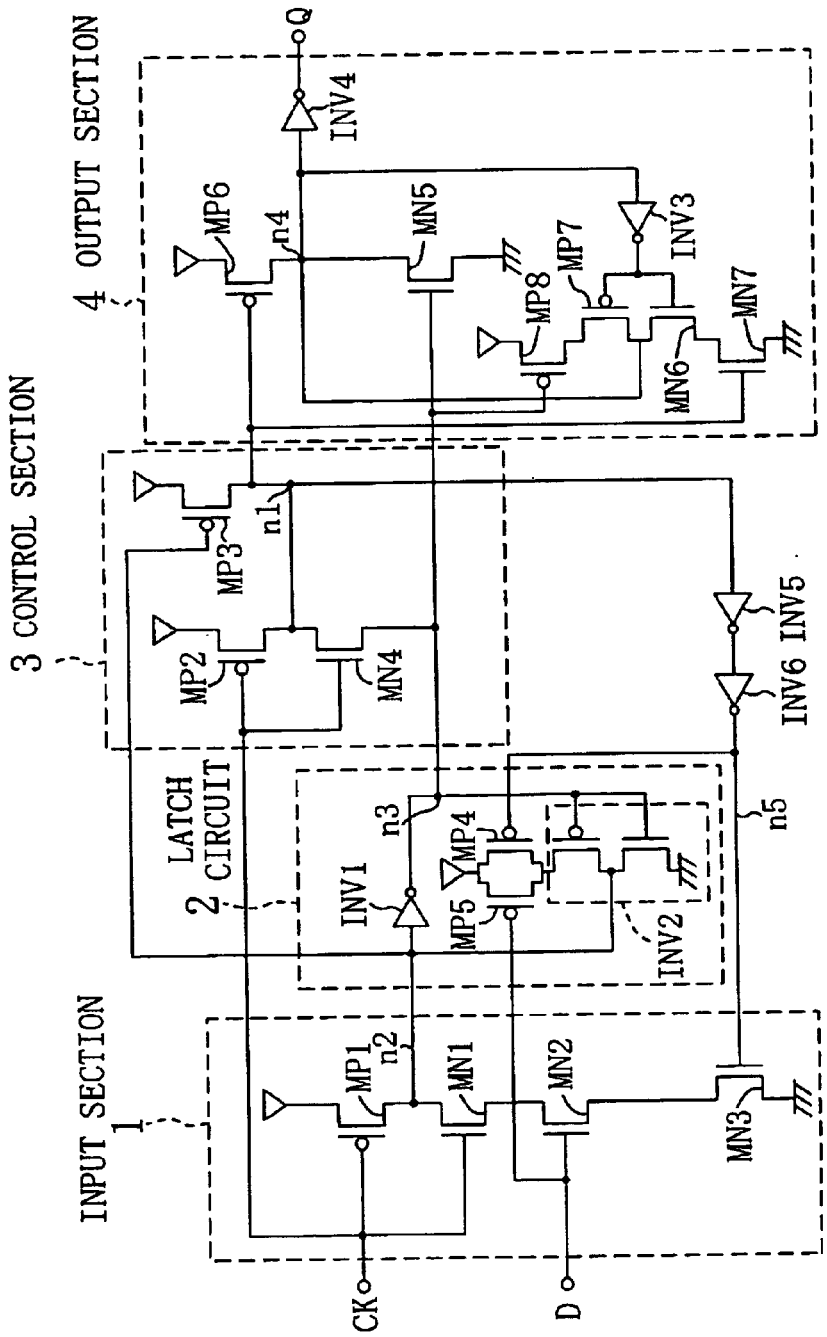
FIG. 7 is a circuit diagram showing a flip-flop circuit according to a fourth embodiment of the present invention

FIG. 7 shows a diagram of still another flip-flop circuit in which an output section 4 has a different configuration from those in the circuits shown in FIGS. 1, 3, 4, 5 and 6. This flip-flop circuit includes PMOS transistors MP6, MP7 and MP8 and NMOS transistors MN6 and MN7, instead of the NAND circuit NAND1. With this configuration, although its number of MOS transistors in the output section 4 is larger by one than those in the output sections 4 shown in FIGS. 1, 3, 4 and 5, no signal collision occurs at both the rising and falling of the signal at the node n4. Therefore, the flip-flop circuit can be operated at higher speed.

In FIGS. 6 and 7, the circuit sections other than the output section 4 are illustrated based on the circuit configuration of FIG. 5. However, the configuration of the output section 4 shown in FIG. 6 or 7 can be employed in the circuit configuration of each of FIGS. 1, 3 and 4.

Embodiment 5

Hereinafter, a flip-flop circuit according to a fifth embodiment of the present invention will be described with reference to the drawings.

Figure 8:
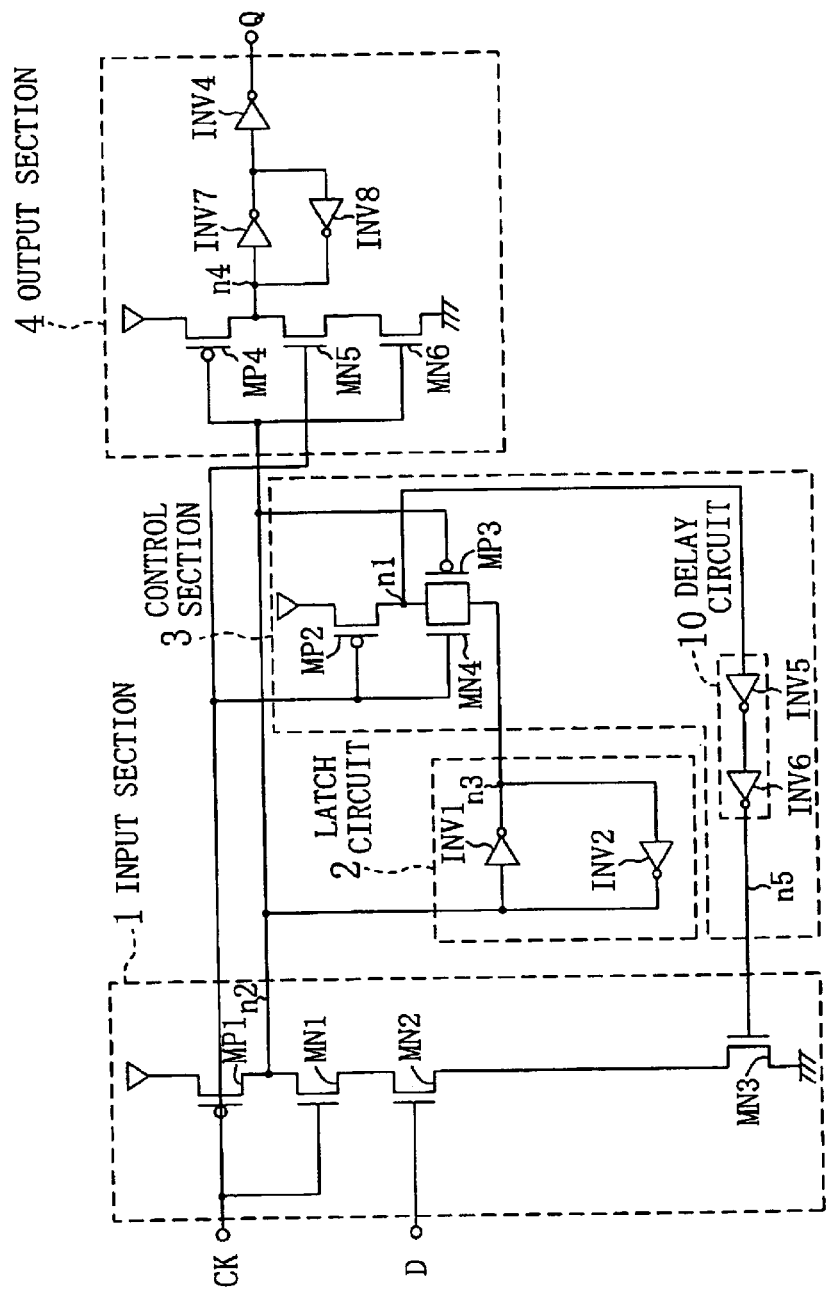
FIG. 8 is a circuit diagram showing a flip-flop circuit according to a fifth embodiment of the present invention.

FIG. 8 is a circuit diagram showing the flip-flop circuit of this embodiment. The flip-flop circuit of this embodiment is different from the circuit of the third embodiment shown in FIG. 4 only in the configuration of the output section 4.

In the flip-flop circuit shown in FIG. 4, two signals, i.e., the signal at the first node n1 of the control section 3 and a signal at a third node n3 of a latch circuit 2 are input to an output section 4. On the other hand, in the flip-flop circuit of this embodiment, an output section 4 receives a clock signal CK and a signal at a second node n2, which is an output node of an input section 1, and outputs an output signal Q. Specifically, the output section 4 includes: a PMOS transistor MP4; two NMOS transistors MN5 and MN6; and three inverter circuits INV4, INV7 and INV8. The PMOS transistor MP4 and the two NMOS transistors MN5 and MN6 are connected in series such that the PMOS transistor MP4 is connected to a power source and the NMOS transistor MN6 is connected to a ground. The clock signal CK is input to the gate of the NMOS transistor MN5, and the gates of the PMOS transistor MP4 and the NMOS transistor MN6 are connected to the node n2. The drain of the PMOS transistor MP4 and the drain of the NMOS transistor MN5 are connected to each other at a connection point, which is a fourth node n4. The inverter circuits INV7 and INV8 have a similar configuration as that of the latch circuit 2 constituted by inverter circuits INV1 and INV2 and hold a value which is the logical inverse of the output signal Q. The inverter circuit INV7 has an input terminal connected to the fourth node n4 and an output terminal connected to an input terminal of the inverter circuit INV4.

In the output section 4 with such a circuit configuration, when the clock signal CK is at a low level, the signal at the second node n2 of the input section 1 is at a high level so that the PMOS transistor MP4 and the NMOS transistor MN5 turn OFF and the signal level at the fourth node n4 is held by a latch circuit constituted by the inverter circuits INV7 and INV8, thus holding the output signal Q. On the other hand, when the clock signal CK is at a high level, the NMOS transistor MN5 turns ON so that the PMOS transistor MP4 and the NMOS transistor MN6 function as a CMOS inverter, thereby outputting a signal which is the inverse of the signal at the second node n2 to the output terminal Q.

Figure 9:
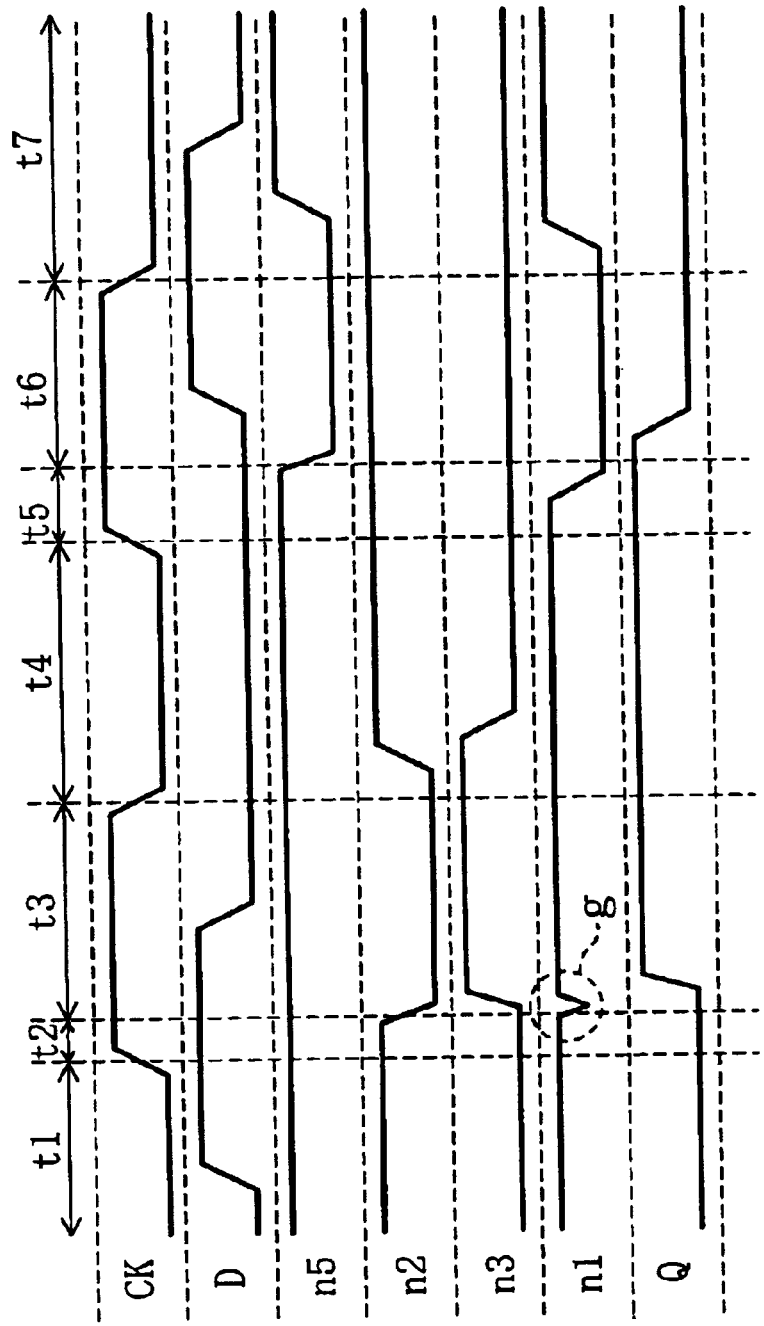
FIG. 9 is a timing chart showing operation of the flip-flop circuit of the fifth embodiment.

FIG. 9 is a timing chart showing how the flip-flop circuit shown in FIG. 8 operates. Hereinafter, the operation of the flip-flop circuit in FIG. 8 will be described with reference to FIG. 9.

In FIG. 8, during periods in which the clock signal CK is at the low level (periods t1, t4 and t7 in FIG. 9), the second node n2, the first node n1, and the fifth node n5 are charged to high levels by PMOS transistors MP1 and MP2. At this time, a low-level signal is applied to the third node n3 at which a signal at the level which is the inverse of the signal level at the second node n2 is generated. The NMOS transistor MN5 and the PMOS transistor MP4 are OFF so that the signal level at the fourth node n4 of the output section 4 is held. Accordingly, the value of the output signal Q is held by the latch circuit constituted by the inverter circuits INV7 and INV8.

Next, in a period in which the clock signal CK changes from the low level to the high level and the input signal D is at a high level (in period t2 in FIG. 9), all the NMOS transistors MN1, MN2 and MN3 turn ON, so that the second node n2 is discharged so that the signal at the second node n2 changes to a low level. At this time, with the transition of the signal at the second node n2 to the low level, a signal at the third node n3 changes to a high level. Accordingly, the transition of the signal at the second node n2 to the low level causes the PMOS transistor MP4 to turn ON so that a signal at the fourth node n4 changes to a high level in the output section 4. Then, the inverter circuits INV7 and INV4 sequentially perform logical inversion on the high-level signal at the fourth node n4, so that a high-level signal is output to the output terminal Q. The signal at the first node n1 is transmitted to the fifth node n5 with a delay.

After the signal at the second node n2 has changed to the low level (period t3 in FIG. 9), even when the input signal D changes from the high level to a low level, the signals at the second and third nodes n2 and n3 are held by the latch circuit 2 constituted by the inverter circuits INV1 and INV2. At this time, the PMOS transistor MP4 of the output section 4 is kept ON and the potential at the fourth node n4 is kept at the high level, so that the potential at the output terminal Q is kept at the high level.

In a period in which the clock signal CK changes from the low level to the high level and the input signal D is at the low level (period t5 in FIG. 9), the NMOS transistor MN2 turns OFF, so that the signal at the second node n2 of the input section 1 is kept at the high level and the signal at the third node n3 of the latch circuit 2 is kept at a low level. The transition of the clock signal CK to the high level causes the NMOS transistor MN4 of the control section 3 to turn ON. Accordingly, since the first node n1 of the control section 3 is connected to the third node n3 via the NMOS transistor MN4 in the ON state, so that the potential at the first node n1 of the control section 3 changes from a high level to a low level at which the potential at the third node n3 is. Then, the signal at the fifth node n5 changes to a low level with a delay corresponding to a delay time of the inverter circuits INV5 and INV6, to cause the NMOS transistor MN3 of the input section 1 to turn OFF. At the same time, in the output section 4, both of the NMOS transistors MN5 and MN6 turn ON and the PMOS transistor MP4 turns OFF, so that the signal at the fourth node n4 changes to a low level, thereby outputting a low-level signal to the output terminal Q.

Thereafter, after the signal at the first node n1 of the control section 3 has changed to the low level with the clock signal CK at the high level (period t6 in FIG. 9), even when the input signal D changes from the low level to the high level, the second node n2 of the input section 1 is not discharged because the NMOS transistor MN3 is OFF, so that the potential at the second node n2 is kept at the high level by the latch circuit 2. As a result, the signal at the output terminal Q is kept at the low level.

As described above, the circuit of this embodiment is configured to achieve the same function as that of the third embodiment while using the configuration of the output section 4 different from that of the third embodiment shown in FIG. 4, and the circuit of this embodiment obtains the same advantages as that of the third embodiment. In addition, the flip-flop circuit of this embodiment can be implemented with 24 MOS transistors—one fewer by comparison with the known circuit shown in FIG. 13.

Embodiment 6

Now, a flip-flop circuit according to a sixth embodiment of the present invention will be described with reference to the drawings.

Figure 10:
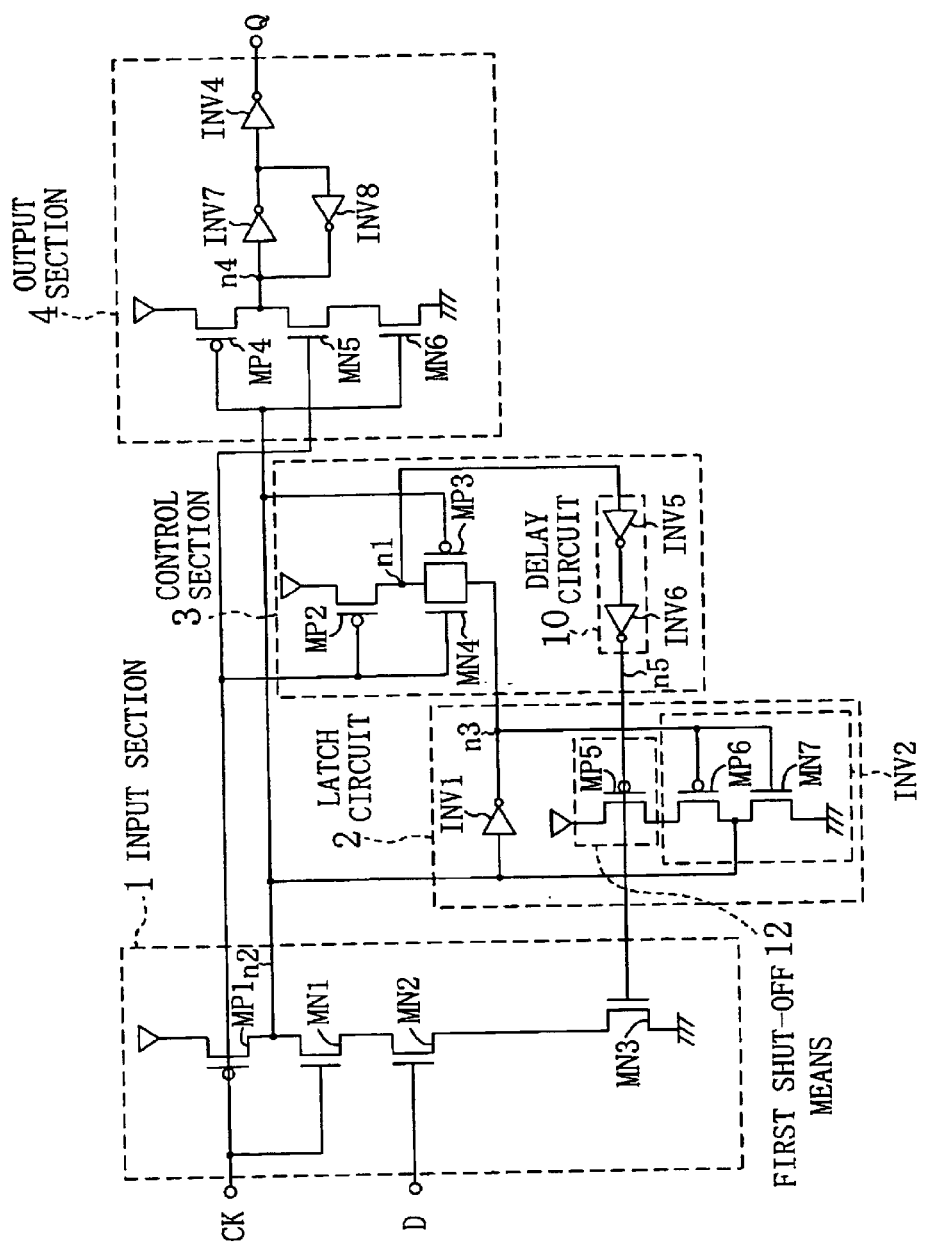
FIG. 10 is a circuit diagram showing a flip-flop circuit according to a sixth embodiment of the present invention.

FIG. 10 is a circuit diagram showing the flip-flop circuit of this embodiment. The flip-flop circuit in FIG. 10 is obtained by further improving the configuration of the latch circuit 2 of the fifth embodiment. Specifically, the difference between the sixth embodiment and the fifth embodiment shown in FIG. 8 is that a latch circuit 2 is provided with a PMOS transistor MP5 in addition to the two inverter circuits INV1 and INV2. In this embodiment, an inverter circuit INV2 is implemented with a CMOS inverter circuit which is constituted by a PMOS transistor MP6 and an NMOS transistor MN7 connected in series and in which the source of the NMOS transistor MN7 is connected to a ground. The PMOS transistor MP5 further provided is inserted between the inverter circuit INV2 and a power source. The PMOS transistor MP5 has a gate connected to a fifth node n5 of a control section 3.

In the circuit configuration of this embodiment, in a period in which a clock signal CK changes from a low level to a high level and an input signal D is at a high level, a second node n2 of an input section 1 is discharged for a shorter time, thus increasing the speed of operation of the flip-flop circuit. Hereinafter, this operation will be described with reference to the timing chart shown in FIG. 9.

In FIG. 10, during periods in which the clock signal CK is at the low level (periods t1, t4 and t7 in FIG. 9), since a fifth node n5 of the control section 3 is charged at a high potential level as described in the second embodiment, the PMOS transistor MP5 is OFF. The second node n2 of the input section 1 is charged at a high potential level by a PMOS transistor MP1.

Next, in a period in which the input signal D is at the high level and the clock signal CK changes from the low level to the high level (in period t2 in FIG. 9), three NMOS transistors MN1, MN2 and MN3 turn ON, so that the second node n2 of the input section 1 is discharged so that a signal at the second node n2 changes to a low level. At this time, in a case where the PMOS transistor MP5, which is a feature of this embodiment, is not provided, i.e., in the case of the flip-flop circuit shown in FIG. 8, the PMOS transistor MP6, which is in an ON state upon receiving a low-level signal from a third node n3, supplies current to the second node n2, so that the inverter circuit INV2 prevents the transition of the signal at the second node n2 to the low level, thereby extending the transition time. On the other hand, in the circuit of this embodiment provided with the PMOS transistor MP5, the PMOS transistor MP5 is OFF and the NMOS transistor MN7 is also OFF at an initial stage of this period, so that the inverter circuit INV2 of the latch circuit 2 does not supply current to the second node n2. Accordingly, the inverter circuit INV2 does not prevent the high-to-low transition of the signal at the second node n2. In this manner, the PMOS transistor MP5 constitutes a first shut-off means 12 for shutting off this unnecessary current supply.

Accordingly, the circuit of this embodiment eliminates the function of the latch circuit 2 of holding the potential at the second node n2, while maintaining a function similar to those of the flip-flop circuits shown in FIGS. 1, 3, 4 and 8. As a result, the transition of the signal at the second node 2 of the input section 1 is performed at high speed. In the subsequent stage, the signal at the second node n2 changes to the low level and then a signal at the third node n3 changes to a high level. Thereafter, the NMOS transistor MN7 constituting the inverter circuit INV2 turns ON so that the potential at the second node n2 is kept at the low level.

In a period in which the clock signal CK changes from the low level to the high level and the input signal D is at a low level (period t5 in FIG. 9), the NMOS transistor MN2 is OFF, so that the signal at the second node n2 is kept at a high level. Accordingly, the signal at the third node n3 is also kept at a low level. In this manner, the first node n1 is connected to the third node n3 via an NMOS transistor MN4 of a control section 3 in an ON state, as described above, so that the potential at the first node n1 changes from a high level to a low level. Then, the potential at the fifth node n5 changes to a low level with a delay corresponding to a time required for the transmittance of the signal through inverter circuits INV5 and INV6. At this time, the PMOS transistors MP5 and MP6 turn ON and the potential at the second node n2 is kept at the high level.

As described above, the flip-flop circuit of this embodiment has a function of reducing operation time as compared to the known circuit shown in FIG. 13 while using 25 MOS transistors, which are the same in number as those used in the known circuit.

In this embodiment, the flip-flop circuit shown in FIG. 8 is modified. Alternatively, the first, second or third embodiment shown in FIG. 1, 3 or 4 may be modified.

Embodiment 7

Now, a flip-flop circuit according to a seventh embodiment of the present invention will be described with reference to the drawings.

Figure 11:
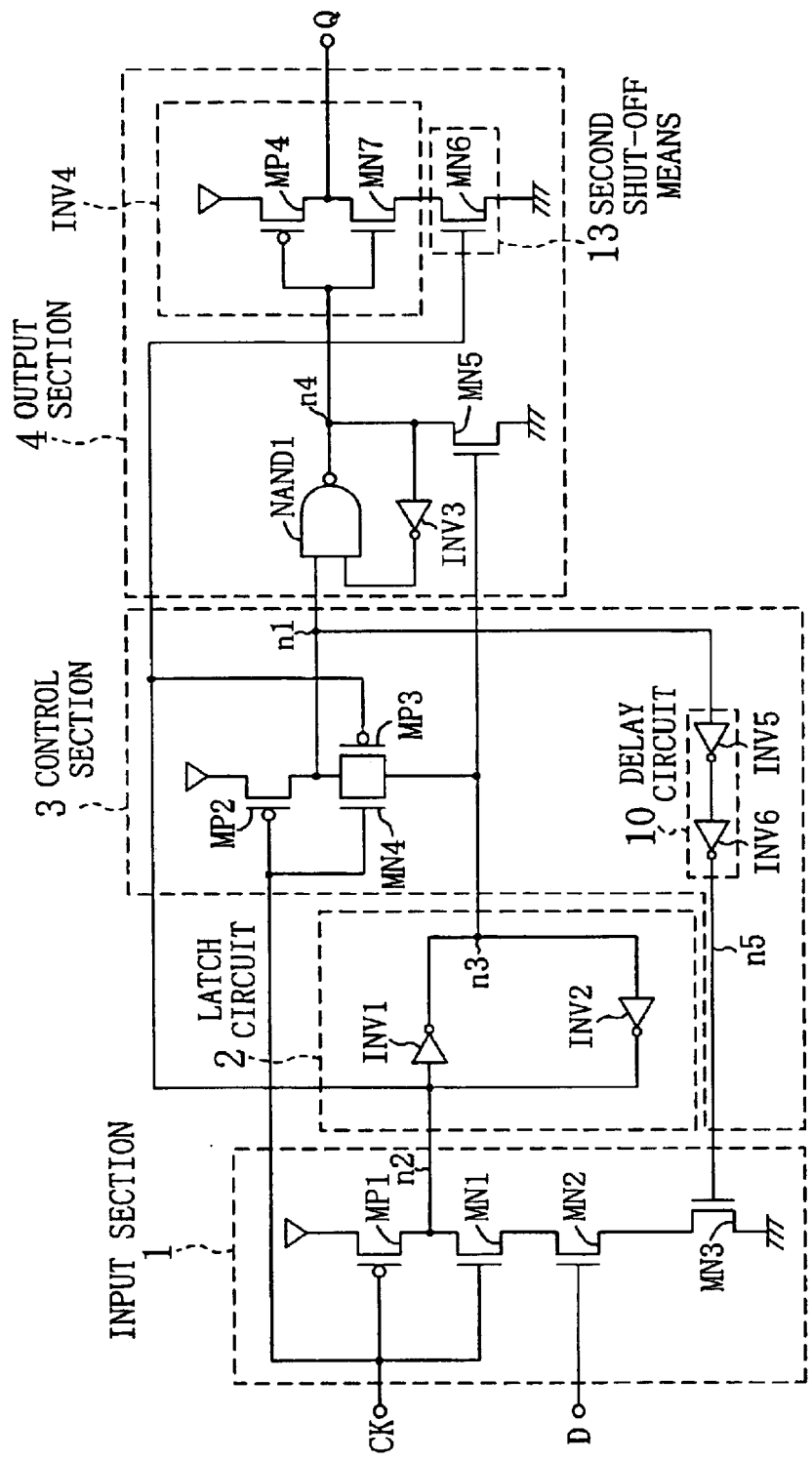
FIG. 11 is a circuit diagram showing a flip-flop circuit according to a seventh embodiment of the present invention.

FIG. 11 is a circuit diagram showing the flip-flop circuit of this embodiment. The flip-flop circuit of the seventh embodiment is different from that of the third embodiment shown in FIG. 4 in that the output section 4 is improved.

Specifically, in the circuit of this embodiment shown in FIG. 11, an inverter circuit INV4 is a CMOS inverter circuit constituted by a PMOS transistor MP4 and an NMOS transistor MN7, and an NMOS transistor MN6 is provided between the inverter circuit INV4 and a ground. The gate of the NMOS transistor MN6 is connected to a second node n2 of an input section 1.

In the circuit of this embodiment, in a period in which an input signal D is at a high level and a clock signal CK changes from a low level to a high level, when a glitch g in which a signal at a first node n1 temporarily falls from an initial high level to a low level and then rises back to the high level is generated, it is possible to prevent generation of a glitch at an output signal Q. Hereinafter, this operation will be described in detail.

When the clock signal CK is at the low level, the potential at the second node n2 of a latch circuit 2 is at a high level, the potential at a third node n3 is at a low level and the potential at the first node n1 of a control section 3 is at the high level at an initial stage. In a period during which the clock signal CK changes from the low level to the high level, when the input signal D is at the high level, the NMOS transistor MN4 turns ON and the potential at the first node n1 starts transition to the low level so as to be at the same level as that at the third node n3. However, when the signal at the second node n2 changes to a low level in accordance with the transition of the clock signal CK to the high level, the signal at the third node n3 changes to a high level and, on the other hand, a PMOS transistor MP3 turns ON, so that the potential at the first node n1 stops the transition to the low level and changes to the high level at which the potential at the third node n3 is. Accordingly, a glitch waveform changing from the high level to the low level temporally and then rising back to the high level is generated on the signal at the first node n1.

At this time, if the lowest potential of the glitch is lower than the logical threshold voltage of a NAND circuit NAND1, a glitch changing from an initial low level to a high level temporally and then rising back to the low level tends to be generated also at a fourth node n4 of the output section 4. However, in this embodiment, the potential at the second node n2 changes to the low level and the NMOS transistor MN6 turns OFF before the glitch is transmitted from the first node n1 of the control section 3 to the fourth node n4 of the output section 4, so that an output signal Q is kept at a high level. In this manner, the NMOS transistor MN6 serves as a second shut-off means 13 for suppressing generation of a glitch changing from the high level to a low level at the output signal Q.

As described above, in this embodiment, since no glitch is generated at the output terminal, power consumption is reduced.

This embodiment is applied to the flip-flop circuit shown in FIG. 4. Alternatively, of course, the circuit of this embodiment may be applied to the flip-flop circuit shown in FIG. 1, 3, 5, 6, 7, 8, or 10.

Embodiment 8

Figure 12:
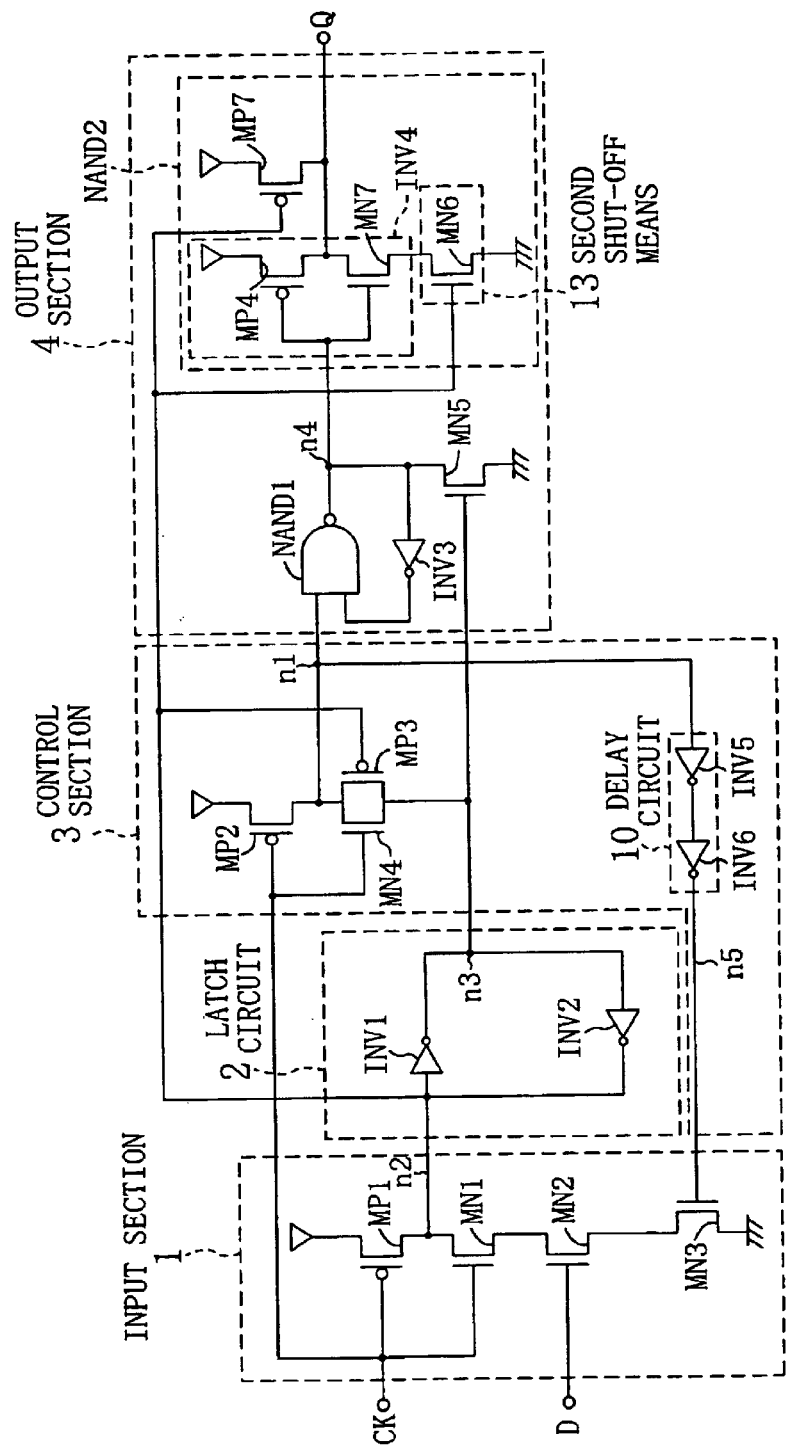
FIG. 12 is a circuit diagram showing a flip-flop circuit according to an eighth embodiment of the present invention.

FIG. 12 is a circuit diagram showing a modified example of a flip-flop circuit according to an eighth embodiment of the present invention.

The eighth embodiment is different from the seventh embodiment shown in FIG. 11 in that a PMOS transistor MP7 is connected between an output terminal Q and a power source. The PMOS transistor MP7 has a gate connected to a second node n2 of an input section 1.

With this configuration, in a period in which an input signal D is at a high level and a clock signal CK changes from a low level to a high level, when a signal at the second node n2 changes from a high level to a low level, the PMOS transistor MP7 turns ON so that an output signal Q changes to a high level faster than the transitions of the signals at the first, third and fourth nodes n1, n3 and n4. A circuit constituted by two PMOS transistor MP4 and MP7 and two NMOS transistor MN6 and MN7 serves as a NAND circuit NAND2 receiving two inputs from the second and fourth nodes n2 and n4 to output a signal Q. As in the circuit shown in FIG. 11, no glitch is transmitted to the output signal Q in the circuit of this embodiment.

Accordingly, in this embodiment, in the period in which the input signal D is at the high level and the clock signal CK changes from the low level to the high level, the output signal Q changes to the high level at high speed, thus operating the flip-flop circuit at high speed.

This embodiment is applied to the flip-flop circuit shown in FIG. 11. Alternatively, this embodiment may be applied to the flip-flop circuit shown in FIG. 1, 3, 4, 5, 6, 7, 8, or 10.

What is claimed is:

1. A flip-flop circuit comprising:
   an input terminal;
   a clock terminal;
   an output terminal;
   an input section for receiving a signal input to the input terminal and a clock signal at the clock terminal;
   a latch circuit for latching an output of the input section;
   a control section for controlling operation of the input section, the control section having a first node; and
   an output section for outputting a signal from the output terminal,
   wherein the input section has a second node, receives a signal at the first node of the control section as a control signal, outputs a high-level signal from the second node independently of the value of the input signal at the input terminal when the clock signal at the clock terminal is at a low level, and outputs, to the second node, a logic signal depending on the input signal at the input terminal when the clock signal at the clock terminal is at a high level and the control signal from the first node of the control section is at a high level,
   the latch circuit has a third node, receives a signal at the second node of the input section, holds the signal at the second node when the clock signal at the clock terminal is at the high level and the control signal from the first node of the control section is at a low level, and outputs, to the third node, a signal which is the logical inverse of the signal at the second node of the input section,
   the control section receives the clock signal at the clock terminal and the signal at third node of the latch circuit, outputs a high-level signal to the first node when the clock signal at the clock terminal is at the low level, and outputs, to the first node, a signal at the same level as that of the signal at the third node of the latch circuit with a delay corresponding to a predetermined delay value when the clock signal at the clock terminal is at the high level, and
   the output section receives the signal at the first node of the control section and the signal at the third node of the latch circuit, holds the signal at the output terminal when the signal at the first node of the control section is at the high level and the signal at the third node of the latch circuit is at a low level, outputs, to the output terminal, a logic signal depending on the signal at the first node when the signal at the first node of the control section is at the low level, and outputs a logic signal depending on the signal at the third node when the signal at the third node is at a high level.

2. A flip-flop circuit comprising:
   an input terminal;
   a clock terminal;
   an output terminal;
   an input section for receiving a signal input to the input terminal and a clock signal at the clock terminal;
   a latch circuit for latching an output of the input section;
   a control section for controlling operation of the input section, the control section having a first node; and
   an output section for outputting a signal from the output terminal,
   wherein the input section has a second node, receives a signal at the first node of the control section as a control signal, outputs a high-level signal from the second node independently of the value of the input signal at the input terminal when the clock signal at the clock terminal is at a low level, and outputs, to the second node, a logic signal depending on the input signal at the input terminal when the clock signal at the clock terminal is at a high level and the control signal from the first node of the control section is at a high level,
   the latch circuit has a third node, receives a signal at the second node of the input section, holds the signal at the second node when the clock signal at the clock terminal is at the high level and the control signal from the first node of the control section is at a low level, and outputs, to the third node, a signal which is the logical inverse of the signal at the second node of the input section,
   the control section receives the clock signal at the clock terminal and the signal at third node of the latch circuit, outputs a high-level signal to the first node when the clock signal at the clock terminal is at the low level, and outputs, to the first node, a signal at the same level as that of the signal at the third node of the latch circuit with a delay corresponding to a predetermined delay value when the clock signal at the clock terminal is at the high level, and
   the output section holds the signal at the output terminal when a low-level signal is applied to the clock terminal, while outputting, to the output terminal, a logic signal depending on the signal at the second node when a high-level signal is applied to the clock terminal.

3. The flip-flop circuit of claim 1, wherein the control section includes a delay circuit for delaying the control signal to be output to the input section.

4. The flip-flop circuit of claim 2, wherein the control section includes a delay circuit for delaying the control signal to be output to the input section.

5. The flip-flop circuit of claim 1, wherein the latch circuit includes first shut-off means for shutting off a path for current supply to the second node of the input section when the signal at the first node of the control section is at the high level and the signal at the third node of the latch circuit is at the low level.

6. The flip-flop circuit of claim 2, wherein the latch circuit includes first shut-off means for shutting off a path for current supply to the second node of the input section when the signal at the first node of the control section is at the high level and the signal at the third node of the latch circuit is at the low level.

7. The flip-flop circuit of claim 1, wherein the output section includes second shut-off means for shutting off a transmission of a low-level signal, which temporally appears at the first node of the control section, to the output terminal when the signal at the second node of the latch circuit is at a low level.

8. The flip-flop circuit of claim 2, wherein the output section includes second shut-off means for shutting off a transmission of a low-level signal, which temporally appears at the first node of the control section, to the output terminal when the signal at the second node of the latch circuit is at a low level.

9. The flip-flop circuit of claim 1, wherein the output section includes a PMOS transistor having a gate terminal connected to the second node, a source connected to a power supply and a drain connected to the output terminal.

10. The flip-flop circuit of claim 2, wherein the output section includes a PMOS transistor having a gate terminal connected to the second node, a source connected to a power supply and a drain connected to the output terminal.

* * * * *